(12) United States Patent
Gleissner et al.

(10) Patent No.: US 9,887,120 B2
(45) Date of Patent: Feb. 6, 2018

(54) APPARATUS FOR TREATING SURFACES OF WAFER-SHAPED ARTICLES

(71) Applicant: LAM RESEARCH AG, Villach (AT)

(72) Inventors: Andreas Gleissner, Dobriach (AT); Michael Brugger, Millstatt (AT); Thomas Wirnsberger, Seeboden (AT)

(73) Assignee: Lam Research AG, Villach (AT)

( * ) Notice: Subject to any disclaimer, the term of this patent is extended or adjusted under 35 U.S.C. 154(b) by 107 days.

(21) Appl. No.: 14/931,577

(22) Filed: Nov. 3, 2015

(65) Prior Publication Data

US 2017/0125281 A1    May 4, 2017

(51) Int. Cl.
*B23B 31/163* (2006.01)
*H01L 21/687* (2006.01)

(52) U.S. Cl.
CPC .. *H01L 21/68728* (2013.01); *B23B 31/16004* (2013.01); *B23B 2260/10* (2013.01); *Y10T 279/19* (2015.01); *Y10T 279/1926* (2015.01)

(58) Field of Classification Search
CPC .......... B23B 31/16004; B23B 2260/10; H01L 21/68785; H01L 21/68735; H01L 21/68728; Y10T 279/1926; Y10T 279/19
See application file for complete search history.

(56) References Cited

U.S. PATENT DOCUMENTS

| | | | | |
|---|---|---|---|---|
| 2,977,128 A * | 3/1961 | Judelson | ........... | B23B 31/16012 279/110 |
| 3,892,419 A * | 7/1975 | Jackson | ................. | B23B 31/08 279/114 |
| 4,222,577 A * | 9/1980 | Giffin | ............... | B23B 31/16004 269/156 |
| 4,903,717 A | 2/1990 | Sumnitsch | | |
| 5,513,668 A | 5/1996 | Sumnitsch | | |
| 5,566,466 A * | 10/1996 | Hearne | ................... | B08B 11/02 198/379 |
| 5,845,662 A | 12/1998 | Sumnitsch | | |
| 6,394,691 B1 * | 5/2002 | Stephan | .................. | B23B 31/18 279/106 |
| 6,485,531 B1 | 11/2002 | Schob | | |
| 6,827,092 B1 * | 12/2004 | Smith | ............... | H01L 21/68728 134/147 |
| 7,354,481 B2 * | 4/2008 | Okuno | .............. | H01L 21/68728 118/503 |
| 8,490,634 B2 | 7/2013 | Obweger et al. | | |
| 2006/0157942 A1 * | 7/2006 | Ferrari | ................ | B60C 25/0545 279/114 |
| 2012/0152069 A1 * | 6/2012 | Hyatt | ................ | B23B 29/03446 82/1.11 |
| 2017/0125274 A1 * | 5/2017 | Swaminathan | ..... | H01L 21/6833 |

FOREIGN PATENT DOCUMENTS

WO    WO 9614182 A1 *    5/1996    ........... B23B 31/123

* cited by examiner

*Primary Examiner* — Eric A Gates
*Assistant Examiner* — Chwen-Wei Su

(57) ABSTRACT

A rotary chuck for processing wafer-shaped articles comprises a chuck body having a series of gripping pins that are movable by sliding horizontally and in unison relative to the chuck body from a first position in which the gripping pins are relatively more retracted into the chuck body to a second position in which the gripping pins are relatively more extended from the chuck body and in which the gripping pins are positioned so as to support a wafer-shaped article of a predetermined diameter.

14 Claims, 2 Drawing Sheets

APPARATUS FOR TREATING SURFACES OF WAFER-SHAPED ARTICLES

BACKGROUND OF THE INVENTION

1. Field of the Invention

The invention relates generally to an apparatus for treating surfaces of wafer-shaped articles, such as semiconductor wafers.

2. Description of Related Art

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903,717 and 5,513,668.

Alternatively, a chuck in the form of a ring rotor adapted to support a wafer may be located within a closed process chamber and driven without physical contact through an active magnetic bearing, as is described for example in U.S. Pat. No. 8,490,634.

For chucks of the type described in U.S. Pat. No. 8,490,634, the chuck body overlies a peripheral region of the wafer, such that for some processes this region cannot be adequately treated. U.S. Pat. No. 5,845,662 discloses a ring-shaped chuck that does not significantly overlap a supported wafer, but a basket-like configuration of pivotable or flexible fingers is required, which keeps the wafer spaced axially apart from the ring-shaped chuck, and increases the size and complexity of the device.

SUMMARY OF THE INVENTION

In one aspect, the present invention relates to a rotary chuck for processing wafer-shaped articles, comprising a chuck body having a series of gripping pins that are movable by sliding horizontally and in unison relative to the chuck body from a first position in which the gripping pins are relatively more retracted into the chuck body to a second position in which the gripping pins are relatively more extended from the chuck body and in which the gripping pins are positioned so as to support a wafer-shaped article of a predetermined diameter.

In preferred embodiments of the rotary chuck according to the present invention, each of the gripping pins comprises a proximal part mounted within the chuck body and a distal part that projects outwardly from the chuck body, the distal part sliding through a respective opening in the chuck body during movement between the first and second positions.

In preferred embodiments of the rotary chuck according to the present invention, the distal parts slide horizontally through the respective openings toward a center of the chuck body during movement from the first position to the second position.

In preferred embodiments of the rotary chuck according to the present invention, each of the distal parts comprises a respective distal end configured to contact and support a peripheral edge of a wafer-shaped article when held by the rotary chuck, and wherein the distal ends face one another in the first and second positions of the series of gripping pins.

In preferred embodiments of the rotary chuck according to the present invention, each of the distal ends comprises a horizontal notch.

In preferred embodiments of the rotary chuck according to the present invention, the chuck body is ring-shaped and adapted to be rotated about a central axis of rotation.

In preferred embodiments of the rotary chuck according to the present invention, the ring-shaped chuck body has an inner diameter that is greater than or equal to the predetermined diameter.

In preferred embodiments of the rotary chuck according to the present invention, each of the gripping pins comprises a proximal part mounted within the chuck body and a distal part that projects outwardly from the chuck body, the distal part sliding horizontally through a respective opening in the chuck body toward the central axis of rotation during movement from the first position to the second position.

In preferred embodiments of the rotary chuck according to the present invention, a drive ring is mounted coaxially within the chuck body for limited rotation relative thereto, the drive ring comprising a series of cam surfaces each of which engages a respective one of the series of gripping pins during relative rotation between the drive ring and the chuck body and moves the series of gripping pins from the second position to the first position.

In preferred embodiments of the rotary chuck according to the present invention, each of the series of cam surfaces is comprised by a corresponding slot formed in the drive ring, each the slot extending obliquely to the central axis of rotation, and wherein a proximal part of each of the series of gripping pins is disposed within a corresponding one of the slots.

In preferred embodiments of the rotary chuck according to the present invention, the drive ring comprises at least one permanent magnet affixed thereto, to permit the drive ring to be held stationary in relation to rotation of the chuck body, thereby to move the series of gripping pins from the second position to the first position.

In preferred embodiments of the rotary chuck according to the present invention, the rotary chuck is configured to hold a wafer-shaped article of a predetermined diameter D2, and wherein the chuck body defines a central opening having a diameter D1, wherein D1≥D2−10 mm, whereby an overlap between a peripheral region of a wafer-shaped article of diameter D2 and the rotary chuck is at most 5 mm.

In preferred embodiments of the rotary chuck according to the present invention, the chuck body is a magnetic ring rotor adapted to be drive in rotation without contact by a surrounding magnetic stator.

In another aspect, the present invention relates to a device for processing wafer-shaped articles, comprising a process chamber and a rotary chuck disposed within the process chamber, the rotary chuck comprising a chuck body having a series of gripping pins that are movable by sliding horizontally and in unison relative to the chuck body from a first position in which the gripping pins are relatively more retracted into the chuck body to a second position in which the gripping pins are relatively more extended from the chuck body and in which the gripping pins are positioned so as to support a wafer-shaped article of a predetermined diameter.

In preferred embodiments of the device according to the present invention, each of the gripping pins comprises a proximal part mounted within the chuck body and a distal part that projects outwardly from the chuck body, the distal part sliding through a respective opening in the chuck body during movement between the first and second positions.

In preferred embodiments of the device according to the present invention, the distal parts slide horizontally through the respective openings toward a center of the chuck body during movement from the first position to the second position.

In preferred embodiments of the device according to the present invention, each of the distal parts comprises a respective distal end configured to contact and support a peripheral edge of a wafer-shaped article when held by the rotary chuck, and wherein the distal ends face one another in the first and second positions of the series of gripping pins.

In preferred embodiments of the device according to the present invention, the chuck body is ring-shaped and adapted to be rotated about a central axis of rotation, and further comprising a drive ring mounted coaxially within the chuck body for limited rotation relative thereto, the drive ring comprising a series of cam surfaces each of which engages a respective one of the series of gripping pins during relative rotation between the drive ring and the chuck body and moves the series of gripping pins from the second position to the first position.

In preferred embodiments of the device according to the present invention, each of the series of cam surfaces is comprised by a corresponding slot formed in the drive ring, each the slot extending obliquely to the central axis of rotation, and wherein a proximal part of each of the series of gripping pins is disposed within a corresponding one of the slots.

In preferred embodiments of the device according to the present invention, the drive ring comprises at least one permanent magnet affixed thereto, to permit the drive ring to be held stationary in relation to rotation of the chuck body, thereby to move the series of gripping pins from the second position to the first position In preferred embodiments of the device according to the present invention, the rotary chuck is configured to hold a wafer-shaped article of a predetermined diameter D2, and wherein the chuck body defines a central opening having a diameter D1, wherein D1≥D2−10 mm, whereby an overlap between a peripheral region of a wafer-shaped article of diameter D2 and the rotary chuck is at most 5 mm.

In preferred embodiments of the device according to the present invention, the chuck body is a magnetic ring rotor, and wherein the process chamber comprises a magnetic stator mounted to an exterior surface of the process chamber and surrounding the magnetic ring rotor with a cylindrical wall of the process chamber being disposed between the magnetic stator and the magnetic ring rotor.

BRIEF DESCRIPTION OF THE DRAWINGS

Other objects, features and advantages of the invention will become more apparent after reading the following detailed description of preferred embodiments of the invention, given with reference to the accompanying drawings, in which:

FIG. 1b is an enlarged view of the detail Ib in FIG. 1a;

FIG. 1c is a fragmentary sectional view showing a preferred drive configuration of the chuck of FIG. 1a;

FIG. 2b is a fragmentary sectional view showing a preferred configuration for the gripping pin mechanism of the chuck of FIG. 1a.

DETAILED DESCRIPTION OF PREFERRED EMBODIMENTS

Figure 1A:
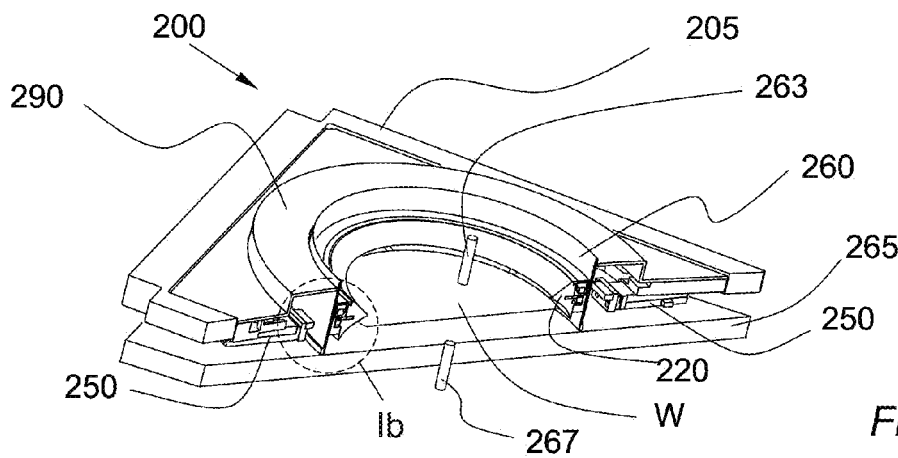
FIG. 1a is a perspective view in section of a rotary chuck and device for processing wafer-shaped articles according to a preferred embodiment of the present invention.
Figure 1B:
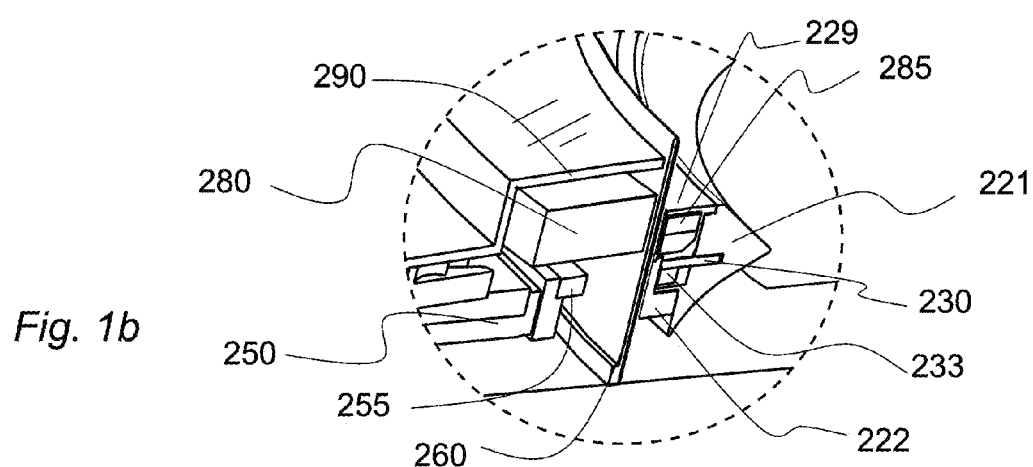
Figure 1C:
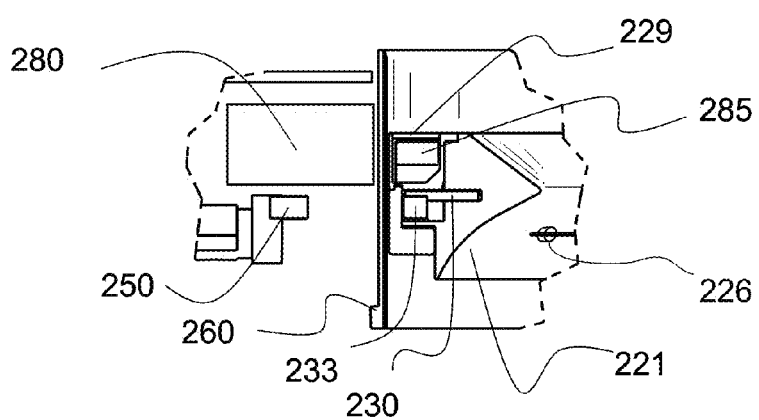

The device 200 of FIG. 1a comprises a chamber, an annular chuck 220 for gripping and rotating a wafer (disc-like article) and a stator 280 (FIG. 1b) disposed within a stator housing 290.

The chamber comprises a cylindrical wall 260, a bottom plate 265 and a top plate (not shown). An upper dispensing tube 263 is led through the top plate and a lower dispensing tube 267 through the bottom plate 265.

The stator 280 is mounted to a stator base plate 205 concentric to the cylindrical wall 260. The stator base plate 205 can be moved in axial direction with respect to the cylinder axis of the cylindrical wall 260, e.g. with pneumatic jacks (not shown). The stator base plate 205 and the stator 280 mounted thereto have central openings, whose diameter is greater than the outer diameter of the cylindrical wall 260. The top plate can also be moved in axial direction in order to open the chamber. In closed position the top plate is sealed against the cylindrical wall.

The stator 280 comprises several coils for axial and radial bearing and for driving the rotor 285, which is part of the annular chuck. Such arrangement is called active bearing and is further described in U.S. Pat. No. 6,485,531.

The diameter of the annular chuck 220 is smaller than the inner diameter of the cylindrical wall so that it can freely levitate and rotate within the cylindrical wall 260. The annular chuck 220 comprises an inner chuck base body 221 with an annular groove circumferentially surrounding the outside of the inner chuck base body 221, the annular groove serving as the bearing for the drive ring 230.

Figure 2A:
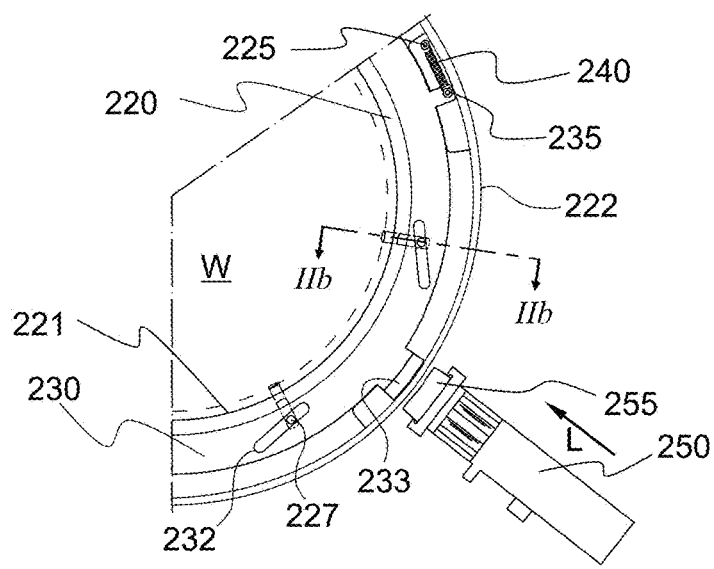
FIG. 2a is a partial plan view along the line IIa-IIa of FIG. 2b.

The drive ring 230 is embodied as a cam ring 230 with obliquely-oriented slots 232. The slots 232 receive the upwardly projecting proximal end parts 227 of gripping pins 226 (FIG. 2a).

This embodiment has six gripping pins 226, each of which has a proximal end 227 that is received in a corresponding slot 232 of the drive ring 230. For securely gripping the wafer W, each gripping pin 226 is equipped with a horizontal notch at its distal end 228 (FIGS. 2b and 2c).

Figure 2B:
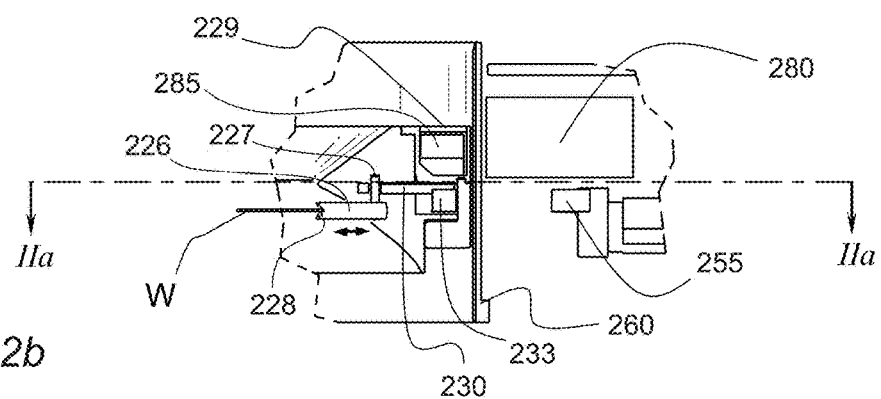
Figure 2C:
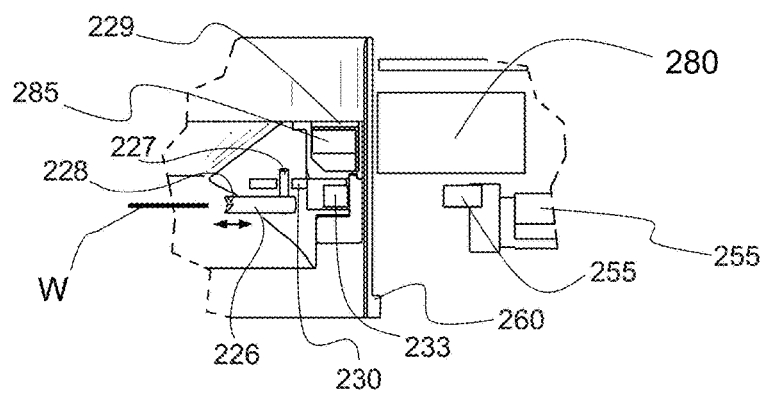
FIG. 2c is a view similar to that of FIG. 2b, showing the pins in their first or retracted position, in which a wafer W may be unloaded from or loaded onto the rotary chuck.

The drive ring 230 may be mounted into the annular groove of the chuck base body 221 by forming the chuck base body 221 in two halves that join at the sectional plane IIa-IIa of FIG. 2b, positioning the gripping pins 226 and drive ring 230 into the lower half of the chuck base body 221, and then securing together the two halves of the chuck base body 221. Thus, the drive ring 230 may be formed in one piece, and may if desired be completely encapsulated by the assembled upper and lower halves of the chuck base body 221.

Alternatively, the drive ring 230 may be formed of two separate segments, which are fixed together when inserted into the annular groove. The chuck base 221 and the drive ring 230 are connected via a helical spring 240 so that the drive ring 230 urges the pins 226 toward positions that are relatively closer to the center of the annular chuck 220.

Two permanent magnets 233 are mounted to the drive ring 230. A plurality of at least twenty-four rotor magnets 285, which are permanent magnets, are evenly arranged around the chuck base body 221. These rotor magnets 285 are part of the drive and bearing unit namely part of the rotor (elements of the active bearing), which is mounted to the chuck base body 221.

The plurality of rotor magnets 285 and the drive ring 230 carrying the permanent magnets 233 are encapsulated in a hollow annular space provided by the chuck base body 221, outer lower chuck cover 222, and the rotor magnet cover 229. Such rotor magnet cover 229 can be a stainless steal jacket. The covers 222 and 229 are annular and concentric with the chuck base body 221.

Attached to the stator base plate 205 is the stator and active bearing unit 280 which is concentrically arranged with respect to the cylindrical wall 260. The bearing unit 280 corresponds with the rotor magnets 285 therefore levitating, bearing and rotating the chuck 220.

Below the active bearing unit 280 there are two pneumatic cylinders 250 mounted to the stator base plate 205. On the distal ends of the rods of the pneumatic cylinders 250 locking magnets 255 (permanent magnets) are arranged. The locking magnets correspond to the permanent magnets 233 of the drive ring 230. The pneumatic cylinders 250 are arranged so that the locking magnets 255 can be radially moved with respect to the axis of the cylindrical wall 260.

When the pins 226 shall be opened e.g. to release a wafer the following procedure is conducted. The pneumatic cylinders 250 move the locking magnets 255 in close proximity to the chuck 220 and the chuck is turned so that the permanent magnets 233 and therewith the drive ring 230 is locked by the locking magnets. A robotic transfer arm is inserted into the chamber through a side opening thereof (not shown), and an end effector of the transfer arm is moved upwardly into a position wherein it grips the peripheral edge of the wafer W at regions between the distal ends 228 of gripping pins 226. Next the chuck is turned while the drive ring stands still and thus the pins 226 open, as shown in FIG. 2c, such that the wafer W is supported entirely by the end effector of the robotic transfer arm, which may then remove the wafer from the chamber. Alternatively the chuck base body 221 might stand still while the pneumatic cylinders 250 are moved so that the locking magnets 255 tangentially turn (along the circumference of the chuck), whereby the drive ring 230 is turned.

In particular, as the chuck 220 is rotated relative to the drive ring 230, the proximal ends 227 of gripping pins 226 are moved radially inwardly by the slots 232 formed in drive ring 230, which in turn causes the distal ends 228 of the gripping pins 226 to slide horizontally into a relatively more retracted position within chuck base body 221, as shown in FIG. 2c. For easing the movement of the gripping pins 226 additional sleeves can be inserted in the chuck base body 221. Such sleeves can be further equipped with bearings in order to prevent liquids and/or gases from leaking into the chuck base body.

When a wafer W is positioned for loading into the chuck, the locking magnets are withdrawn, which allows spring(s) 240 to cause the drive ring 230 and the chuck base body 221 to rotate relative to one another in the opposite direction. Slots 232 thereby drive the proximal ends 227 of gripping pins 226 radially inwardly of the chuck base body, such that the distal ends 228 of the gripping pins 226 move radially inwardly of the chuck and assume the relatively more extended position shown in FIG. 2b, in which pins 226 contact and support the peripheral edge of wafer W.

The novel configuration of gripping pins 226 and the manner in which they are mounted in chuck base body 221, represents an improvement over the configurations shown in U.S. Pat. No. 8,490,634. In particular, the horizontal orientation of the distal ends 228 of pins 226, and the ability of drive ring 230 to move those distal ends between the relatively more retracted and relatively more extended positions shown in FIGS. 2b and 2c by a horizontal sliding motion of those distal ends relative to the chuck base body 221, allows the chuck to be designed so that more of the wafer W can be exposed during processing.

In the chucks of U.S. Pat. No. 8,490,634, where the distal ends of the pins are oriented vertically or substantially vertically, the chuck base body necessarily overlaps the wafer W to a greater extent than is necessary for the novel chuck designs described herein. In particular, for the chucks described in U.S. Pat. No. 8,490,634, the chuck base body will often overlie an annular peripheral region of the wafer W whose width is approximately 10 mm, which, in the case of a wafer whose diameter is 300 mm, represents about 13% of the wafer area.

By contrast, it will be appreciated that the novel gripping pin and drive configuration described herein does not require such an overlap between a wafer and the chuck base body. Chucks for processing semiconductor wafers are designed to hold wafers of a predetermined diameter. If that diameter is taken as D2, then the central opening of the chuck base body of the preferred embodiments of the present invention may be taken as D1, and the chuck may be sized so that D1≥D2−10 mm, which is to say that the overlap between the peripheral region of a wafer of diameter D2 and the rotary chuck preferably is at most 5 mm. However, a lesser extent of overlap may be selected, for example, 2 mm, or there can be no overlap at all, by appropriate selection of the diameter D1 in relation to D2, and the lengths of the distal ends of the gripping pins.

It will be understood that the foregoing description and specific embodiments shown herein are merely illustrative of the invention and the principles thereof, and that modifications and additions may be easily made by those skilled in the art without departing from the spirit and scope of the invention, which is therefore understood to be limited only by the scope of the appended claims.

What is claimed is:

1. A rotary chuck for processing wafer-shaped articles, comprising:
    a chuck body having a series of gripping pins, each gripping pin received by a respective obliquely-oriented extending slot defined within said chuck body, each gripping pin movable by sliding horizontally and in unison relative to said chuck body from a first position in which said gripping pins are relatively more retracted into said chuck body to a second position in which said gripping pins are relatively more extended from said chuck body and in which said gripping pins are positioned so as to support a wafer-shaped article of a predetermined diameter, wherein said chuck body is ring-shaped and adapted to be rotated about a central axis of rotation; and
    a drive ring mounted coaxially within said chuck body for limited rotation relative thereto, said drive ring comprising a series of cam surfaces each of which engages a respective one of said series of gripping pins during relative rotation between said drive ring and said chuck body and moves said series of gripping pins from said second position to said first position, wherein said drive ring comprises at least one permanent magnet affixed thereto to permit said drive ring to be held stationary in relation to rotation of said chuck body to move said series of gripping pins from said second position to said first position.

2. The rotary chuck according to claim 1, wherein each of said gripping pins comprises a proximal part mounted within said chuck body and a distal part that projects outwardly from said chuck body, said distal part sliding through a respective opening in said chuck body during movement between said first and second positions.

3. The rotary chuck according to claim 2, wherein said distal parts slide horizontally through said respective openings toward a center of said chuck body during movement from said first position to said second position.

4. The rotary chuck according to claim 2, wherein each of said distal parts comprises a respective distal end configured to contact and support a peripheral edge of a wafer-shaped article when held by said rotary chuck, and wherein said distal ends face one another in said first and second positions of said series of gripping pins.

5. The rotary chuck according to claim 4, wherein each of said distal ends comprises a horizontal notch.

6. The rotary chuck according to claim 1, wherein said ring-shaped chuck body has an inner diameter that is greater than or equal to said predetermined diameter.

7. The rotary chuck according to claim 1, wherein each of said gripping pins comprises a proximal part mounted within said chuck body and a distal part that projects outwardly from said chuck body, said distal part sliding horizontally through a respective opening in said chuck body toward said central axis of rotation during movement from said first position to said second position.

8. The rotary chuck according to claim 1, wherein said rotary chuck is configured to hold a wafer-shaped article of a predetermined diameter $D2$, and wherein said chuck body defines a central opening having a diameter $D1$, wherein $D1 \geq D2-10$ mm, whereby an overlap between a peripheral region of a wafer-shaped article of diameter $D2$ and said rotary chuck is at most 5 mm.

9. The rotary chuck according to claim 1, wherein said chuck body is a magnetic ring rotor adapted to be drive in rotation without contact by a surrounding magnetic stator.

10. A device for processing wafer-shaped articles, comprising:

a process chamber and a rotary chuck disposed within said process chamber, said rotary chuck comprising a chuck body having a series of gripping pins each gripping pin received by a respective obliquely-oriented extending slot defined within said chuck body, each gripping pin movable by sliding horizontally and in unison relative to said chuck body from a first position in which said gripping pins are relatively more retracted into said chuck body to a second position in which said gripping pins are relatively more extended from said chuck body and in which said gripping pins are positioned so as to support a wafer-shaped article of a predetermined diameter, wherein said chuck body is ring-shaped and adapted to be rotated about a central axis of rotation; and a drive ring mounted coaxially within said chuck body for limited rotation relative thereto, said drive ring comprising a series of cam surfaces each of which engages a respective one of said series of gripping pins during relative rotation between said drive ring and said chuck body and moves said series of gripping pins from said second position to said first position, wherein said drive ring comprises at least one permanent magnet affixed thereto to permit said drive ring to be held stationary in relation to rotation of said chuck body to move said series of gripping pins from said second position to said first position.

11. The device according to claim 10, wherein each of said gripping pins comprises a proximal part mounted within said chuck body and a distal part that projects outwardly from said chuck body, said distal part sliding through a respective opening in said chuck body during movement between said first and second positions.

12. The device according to claim 11, wherein said distal parts slide horizontally through said respective openings toward a center of said chuck body during movement from said first position to said second position.

13. The device according to claim 11, wherein each of said distal parts comprises a respective distal end configured to contact and support a peripheral edge of a wafer-shaped article when held by said rotary chuck, and wherein said distal ends face one another in said first and second positions of said series of gripping pins.

14. The device according to claim 10, wherein said chuck body is a magnetic ring rotor, and wherein said process chamber comprises a magnetic stator mounted to an exterior surface of said process chamber and surrounding said magnetic ring rotor with a cylindrical wall of said process chamber being disposed between said magnetic stator and said magnetic ring rotor.

\* \* \* \* \*